(12) United States Patent
Reiss et al.

(10) Patent No.: US 8,313,969 B2
(45) Date of Patent: Nov. 20, 2012

(54) METHOD OF PREPARING LUMINESCENT NANOCRYSTALS, THE RESULTING NANOCRYSTALS AND USES THEREOF

(75) Inventors: Peter Reiss, Saint Egreve (FR); Li Liang, Los Alamos, NM (US)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/990,627

(22) PCT Filed: Apr. 29, 2009

(86) PCT No.: PCT/EP2009/055231
§ 371 (c)(1),
(2), (4) Date: Dec. 3, 2010

(87) PCT Pub. No.: WO2009/135797
PCT Pub. Date: Nov. 12, 2009

(65) Prior Publication Data
US 2011/0097879 A1    Apr. 28, 2011

(30) Foreign Application Priority Data
May 5, 2008  (FR) ..................................... 08 52977

(51) Int. Cl.
*H01L 21/00*  (2006.01)
(52) U.S. Cl. ..... 438/46; 438/478; 438/497; 257/E21.09; 977/773
(58) Field of Classification Search .................. 438/478, 438/46, 497; 257/E21.09; 977/700, 773, 977/774; 252/301.6 R, 301.6 S
See application file for complete search history.

(56) References Cited

U.S. PATENT DOCUMENTS

| | | | |
|---|---|---|---|
| 2005/0037201 A1* | 2/2005 | Hirai et al. | 428/403 |
| 2006/0202167 A1* | 9/2006 | Landry et al. | 252/301.4 R |
| 2007/0034833 A1* | 2/2007 | Parce et al. | 252/301.36 |
| 2007/0289491 A1* | 12/2007 | Peng et al. | 106/286.6 |

(Continued)

FOREIGN PATENT DOCUMENTS

WO    WO 2005/110916 A2    11/2005

(Continued)

OTHER PUBLICATIONS

Haubold et al., "Strongly Luminescent InP/ZnS Core—Shell Nanoparticles", Chemphyschem 2001, vol. 2, No. 5, pp. 331-334, XP003021606.

(Continued)

*Primary Examiner* — Khiem D Nguyen
(74) *Attorney, Agent, or Firm* — Miles & Stockbridge, P.C.

(57) ABSTRACT

The present invention comprises a method for preparing a nanocrystal having (i) a core comprising a semiconductor comprising A representing a metal or metalloid in the +III oxidation state and B representing an element in the −III oxidation state, coated with (ii) a shell in which the outer portion comprises a semiconductor having the formula $ZnS_{1-x}E_x$, where E represents an element in the −II oxidation state and x is a decimal number such that $0 \leq x < 1$, said method comprising a step consisting of heating a mixture of at least one precursor of A, at least one precursor of B, at least one precursor of zinc, at least one precursor of sulphur and, optionally, at least one precursor of E, from a temperature $T_1$ to a temperature $T_2$ greater than $T_1$ in an increasing manner and so as to form, firstly, said core then said shell. The present invention also concerns a nanocrystal obtainable by the invention method and uses thereof.

29 Claims, 5 Drawing Sheets

U.S. PATENT DOCUMENTS

2008/0160306 A1* 7/2008 Mushtaq et al. .............. 428/402

FOREIGN PATENT DOCUMENTS

WO  WO 2006/134599 A1  12/2006

OTHER PUBLICATIONS

Mićic et al., "Core-Shell Quantum Dots of Lattice-Matched $ZnCeSe_2$ Shells on InP Cores: Experiment and Theory", American Chemical Society, vol. 104, 2000, pp. 12149-12156, XP-002504286.

Xie et al., "Colloidal InP Nanocrystals as Efficient Emitters Covering Blue to Near-Infrared", Journal American Chemical Society, 2007, vol. 129, pp. 15432-15433.

Micic et al., "Synthesis and Characterization of InP, GaP, and $GaInP_2$ Quantum Dots", The Journal of Physical Chemistry, 1995, vol. 99, pp. 7754-7759.

Guzelian et al., "Synthesis of Size-Selected, Surface-Passivated InP Nanocrystals", The Journal of Physical Chemistry, 1996, vol. 100, pp. 7212-7219.

Battaglia et al., "Formation of High Quality InP and InAs Nanocrystals in a Noncoordinating Solvent", Nano Letters 2002, vol. 2, No. 9, pp. 1027-1030, (2002).

Micic et al., "Synthesis and Characterization of InP Quantum Dots", The Journal of Physical Chemistry, 1994, vol. 98, pp. 4966-4969.

* cited by examiner

METHOD OF PREPARING LUMINESCENT NANOCRYSTALS, THE RESULTING NANOCRYSTALS AND USES THEREOF

FIELD OF THE INVENTION

The present invention relates to a method for producing new luminescent materials based on "core/shell" nanocrystals based on semiconductors having a high colour purity and an enhanced fluorescence quantum yield in relation to existing systems, while covering most of the visible spectrum.

The present invention also relates to the luminescent materials obtained and the various applications thereof. Indeed, the field of application of these nanocrystals includes, for example, light-emitting diodes, photovoltaic cells and fluorescent labelling of chemical or biological molecules.

STATE OF THE RELATED ART

Semiconductor crystals are luminescent materials known for several decades. In the 1980s-1990s, it was demonstrated that the emission spectrum thereof is dependent on the size of the crystal when said size becomes sufficiently small. For crystals of a size situated approximately in the range from 1 to 10 nm referred to as "nanocrystals" or "quantum dots", this dependency is extremely pronounced. In fact, the entire pallet of colours in the visible and near infrared and ultraviolet ranges can be obtained with semiconductor nanocrystals through the suitable choice of the size and composition thereof. To cover the visible spectrum, which is very important in the field of light and display (flat screens), the most studied materials are cadmium chalcogenides (CdS, CdSe, CdTe). However, the European RoHS ("Restriction of Hazardous Substances") directive aims to remove the following substances in electrical and electronic equipment (EEE), marketed in Europe from 1 Jul. 2006: Lead, Mercury, Cadmium, Hexavalent chromium, Polybromobiphenyls (PBB), Polybromodiphenylethers (PBDE). Therefore, it is essential to find alternative materials advantageously containing none of these substances for the production of nanocrystals, while retaining the desired optical properties.

As a general rule, the optical quality of a luminescent material consisting of nanocrystals is dependent on a plurality of parameters, the most important of which are:

the size of the nanocrystals, which governs the emission wavelength;

the size distribution of the nanocrystals, which controls the emission band width;

the surface passivation of the nanocrystals, responsible for the fluorescence quantum yield and stability over time.

Indium phosphide (InP) is one of the most advantageous materials for substituting cadmium-based nanocrystals. Due to the forbidden band width thereof of 1.35 eV, it is possible to vary the emission wavelength of InP nanocrystals in the visible spectrum and in the near infrared spectrum by changing the size thereof.

There are a plurality of methods for preparing InP nanocrystals of which, at the present time, the rapid precursor injection method in an organic solvent at a high temperature gives access to the narrowest size dispersion. Narrow nanocrystal size dispersion gives rise to a narrow emission spectrum (a pure emission colour); naturally, this is advantageous for technological applications. Two main synthesis processes are available.

The first process, the so-called "conventional" organometallic synthesis process consists of reacting, at a high temperature (270-300° C.), an indium precursor (e.g. indium chloride or chloroindium oxalate) with the phosphorus precursor (tris(trimethylsilyl)phosphine, $P(TMS)_3$, $P(Si(CH_3)_3)_3$) in trioctylphosphine oxide (TOPO) serving as a reactive medium [1], [2] and [3]. TOPO is referred to as a "coordinating solvent" to emphasise the ability thereof to bond with the surface of the nanocrystals and stabilise same in colloid form. The primary disadvantages of this method are the broad size dispersion of the nanocrystals prepared and the long reaction time (3-7 days).

The second synthesis process is a modification of the "conventional" synthesis process published in 2002. Therein, the reactive medium, instead of TOPO, is a mere alkene, 1-octadecene, classified as a "non-coordinating solvent" [4]. Furthermore, fatty acids, such as lauric, myristic or palmitic acid were used as stabilising ligands. The reaction starts with the rapid injection of the phosphorus precursor ($P(TMS)_3$) in the solvent heated to 300° C. containing the indium precursor (indium acetate) and the stabiliser. The authors report an improvement of the size dispersion which is situated around 10%. In addition, the reaction time is reduced to 3-4 hours.

However, the preparation methods described above do not solve the problem of the fluorescence quantum yield which remains low (typically less than 1%). One method widely used to increase the quantum yield of nanocrystals of varied materials (e.g. CdSe, CdS. etc.) consists of passivating the surface thereof by growing about said "core" a semiconductor shell with a greater forbidden band width. This is referred to as a "core/shell" system in the scientific literature. The methods used for depositing the shell are essentially the same as those used for preparing the core.

To improve the optical properties of InP nanocrystals, various shell materials have been proposed. Micic et al. describe the synthesis of a ternary compound, $CdZnSe_2$, on the surface of InP, so as to minimise the lattice mismatching between the core and shell material [5]. Significant lattice mismatching may induce crystalline defects in the shell or at the core/shell interface and thus decrease the fluorescence efficiency. Nevertheless, the quantum yield achieved with this core/shell system (10%) remains largely inferior to the values obtained with cadmium-based nanocrystals (50-85%).

Haubold et al. coated InP with ZnS and obtained a quantum yield between 15% after 3 days and 23% after 3 weeks [6]. The method used for this synthesis of these core/shell nanocrystals involves:

$a_1$) synthesis of InP core crystals according to the first synthesis process described above;

$a_2$) purification of the InP crystals by means of precipitation and washing with methanol;

$a_3$) growth of the ZnS shell. For this step, the InP nanocrystals are dispersed in trioctylphosphine (TOP) at 200° C., and a mixture of diethylzinc and bis(trimethylsilyl) sulphide is injected. The temperature is then increased briefly to 260° C. before being reduced to 100° C. for 1 hour. Subsequently, the reaction mixture is kept in an inert atmosphere (nitrogen) for several days or weeks;

$a_4$) purification by means of precipitation and washing of the nanocrystals with methanol;

$a_5$) separation of the sample into size fractions by means of selective precipitation.

The problems associated with this method arise from the use of pyrophoric precursors for the growth of the shell (diethylzinc and bis(trimethylsilyl) sulphide)), the progression of the optical properties of a very long period (weeks), and finally the relatively low quantum yield in relation to II-VI semiconductor-based core/shell systems. The authors conclude that the coating by the ZnS shell of InP nanocrystals is not complete, which would restrict the fluorescence quantum yield.

More recently, Peng et al. proposed a new protocol for InP/ZnS core/shell nanocrystal synthesis [7]. In this case, the synthesis of the core crystals is similar to the second synthesis process as described above, but the addition of an amine (1-octylamine), injected at the same time as the phosphorus precursor makes it possible to produce the reaction at 180-190° C. instead of 270-300° C. The shell is then grown as follows:

$b_1$) at 150° C. a certain quantity of zinc distearate (zinc precursor) is injected into the flask containing the InP nanocrystals. Ten minutes later, the same quantity of elemental sulphur dissolved in octadecene (sulphur precursor) is added;

$b_2$) the temperature is increased to 220° C. for 30 minutes to grow the ZnS shell;

$b_3$) the temperature is reduced again to 150° C. to repeat the addition of the zinc precursor, followed by the sulphur precursor using a greater quantity and the same sequence as above;

$b_4$) the temperature is increased to 220° C. for 30 minutes;

$b_5$) the nanocrystals are purified by adding hexane and extracting with methanol.

Although this method makes it possible to do away with pyrophoric precursors for the growth of the shell and the intermediate purification between the synthesis of the core crystals and the growth of the shell, the method remains complex to implement. The difficulties for the adaptation thereof on an industrial scale are particularly associated with the rapid injection of the pyrophoric phosphorus precursor during the synthesis of the InP crystals and the control of the temperature during multiple ZnS precursor injections. The fluorescence quantum yield of the nanocrystals obtained with this method is up to 40%. Still inferior to calcium-chalgogenide-based nanocrystals, this value is the best published for InP-based nanocrystals.

In sum, the methods for producing InP-based nanocrystals reported to date do not make it possible to achieve fluorescence quantum yields greater than 50%, which limits the technological application thereof. The methods described for the synthesis of InP nanocrystals having a low size dispersion involve the rapid injection of a pyrophoric precursor in a reaction medium at a high temperature, which is difficult to perform on a large scale.

Finally, the synthesis of InP/ZnS core/shell nanocrystals requires a method in two steps, the synthesis of the InP core crystals, followed by the growth of the ZnS shell, during which precursors again need to be injected into the reaction medium while controlling the temperature precisely.

DESCRIPTION OF THE INVENTION

The present invention solves the technical problems and disadvantages listed above.

Indeed, the present invention proposes a new method for the synthesis of InP/ZnS core/shell nanocrystals having a fluorescence quantum yield higher than the values reported to date and, in particular, greater than 50% at ambient temperature and also having a high stability against photo-oxidation.

The method according to the present invention is much simpler than all the methods described in the prior art since the InP/ZnS core/shell nanocrystal synthesis is performed in a single step. The method according to the invention does not require an intermediate purification step. Furthermore, no size sorting step (e.g. by means of selective precipitation) is required due to the narrow size dispersion of the samples obtained directly after synthesis.

Moreover, the method is characterised by the lack of injection of the precursors and, in particular, rapid injection of the pyrophoric phosphorus precursor in the reaction medium at a high temperature. The precursor(s) may merely be added to the reaction medium at ambient temperature. Furthermore, no addition of any precursor is required after the start of the reaction and the temperature rise.

Finally, the method according to the present invention is characterised not only in that it enables the preparation of InP/ZnS core/shell nanocrystals, but also it is suitable for generalisation for the preparation of core/shell nanocrystals with a core comprising a semiconductor having the formula AB and a shell comprising at least one semiconductor having the formula CD where A represents a metal or metalloid in the +III oxidation state, B represents an element in the −III oxidation state, C represents a metal or metalloid in the +II oxidation state and D represents an element in the −II oxidation state.

The present invention relates to a method for preparing a nanocrystal having (i) a core comprising a semiconductor comprising A representing a metal or metalloid in the +III oxidation state and B representing an element in the −III oxidation state, coated with (ii) a shell in which the outer portion comprises a semiconductor having the formula $ZnS_{1-x}E_x$, where E represents an element in the −II oxidation state and x is a decimal number such that $0 \leq x < 1$, said method comprising a step consisting of heating a mixture of at least one precursor of A, at least one precursor of B, at least one precursor of zinc, at least one precursor of sulphur and, optionally, at least one precursor of E, from a temperature $T_1$ to a temperature $T_2$ greater than $T_1$ in an increasing manner and so as to form, firstly, said core then said shell.

More specifically, the method according to the present invention comprises the following steps:

a) preparing a mixture of at least one precursor of A, at least one precursor of B, at least one zinc precursor, at least one sulphur precursor and optionally at least one precursor of E, at said temperature $T_1$, b) heating the mixture obtained in step (a) to said temperature $T_2$, c) purifying the nanocrystals having a core comprising a semiconductor having the formula AB encompassed by a shell in which the outer layer comprises a semiconductor having the formula $ZnS_{1-x}E_x$, obtained in step (b).

The core of the nanocrystal prepared according to the method according to the invention comprises a semiconductor comprising A representing a metal or metalloid in the +III oxidation state and B representing an element in the −III oxidation state, said type of semiconductor being referred to as III-V.

A, the metal or metalloid in the +III oxidation state, forming with B the semiconductor comprised in the core of the nanocrystal prepared according to the invention is selected from gallium (Ga), indium (In), aluminium (Al) and mixtures thereof.

B, the element in the −III oxidation state forming with A the semiconductor comprised in the core of the nanocrystal prepared according to the invention is selected from antimony (Sb), arsenic (As), phosphorus (P), nitrogen (N) and mixtures thereof.

Examples of semiconductors having the formula AB comprised in the core of the nanocrystal prepared according to the method according to the invention are GaAs, GaSb, GaN, GaP, InAs, InSb, InN, InP, AlAs, AlSb, AlN, AlP, InGaAs, InGaSb, InGaN, InGaP, InAlAs, InAlSb, InAlN, InAlP, GaAlAs, GaAlSb, GaAlN, GaAlP and mixtures thereof. In particular, the core of the nanocrystal comprises a semiconductor having the formula AB selected from InP, InAs, InGaP and mixtures thereof and, more specifically, said semiconductor is InP.

Advantageously, the core of the nanocrystal prepared according to the method according to the invention consists exclusively of a semiconductor as defined above.

The nanocrystal prepared according to the method of the present invention comprises a shell in which the outer portion comprises a semiconductor having the formula $ZnS_{1-x}E_x$, where E represents an element in the −II oxidation state and x is a decimal number such that $0 \leqq x < 1$.

E is an element in the −II oxidation state particularly selected from oxygen (O), selenium (Se), tellurium (Te) and mixtures thereof.

The shell of the nanocrystal prepared according to the method according to the invention may consist of a single layer or a plurality of layers (i.e. be a multi-layer shell). If the shell only consists of a single layer, the outer portion of the shell corresponds to said layer.

If the shell consists of a plurality of layers, the outer portion of the shell corresponds to the outer layer of the shell. The term "outer layer" refers, within the scope of the present invention, to the layer of the shell furthest from the core of the nanocrystal and in direct contact with the medium or environment in which the nanocrystal is situated. A multi-layer shell may comprise from 2 to 10, particularly from 2 to 5 different semiconductor layers. In this way, various alternative embodiments may be envisaged for the shell of the nanocrystal prepared using the method according to the invention.

In a first alternative embodiment, x in the formula $ZnS_{1-x}E_x$ is equal to 0 and the shell is only formed of one layer which is thus the ZnS layer.

In a second alternative embodiment, x in the formula $ZnS_{1-x}E_x$ is such that $0 < x < 1$ and the shell is only formed of one layer.

In a third alternative embodiment, x in the formula $ZnS_{1-x}E_x$ is equal to 0 and the shell comprises at least two different layers of which the outer layer is a ZnS layer.

In a fourth alternative embodiment, x in the formula $ZnS_{1-x}E_x$ is such that $0 < x < 1$ and the shell comprises at least two different layers.

Furthermore, the layer(s) of the shell of the nanocrystal prepared according to the method according to the invention may have a uniform chemical composition or, within the same layer, a different chemical composition and, in particular, a chemical composition in gradient form. In this instance, the outer portion of the shell will consist of the outer zone of a shell having one layer and the outer zone of the outer layers of a multi-layer shell.

In the case of a multi-layer shell, the layer(s) comprised between the core of the nanocrystal and the outer layer having the formula $ZnS_{1-x}E_x$ as defined above may comprise a semiconductor having the formula AB as defined above and/or a semiconductor having the formula CD where C represents a metal or metalloid in the +II oxidation state and D represents an element in the −II oxidation state. A semiconductor having the formula CD is also referred to as II-VI.

The metal or metalloid C in the +II oxidation state, is particularly selected from magnesium (Mg), calcium (Ca), strontium (Sr), barium (Ba), zinc (Zn), cadmium (Cd), mercury (Hg), tin (Sn), lead (Pb) and mixtures thereof. The element D in the −II oxidation state is particularly selection from oxygen (O), sulphur (S), selenium (Se), tellurium (Te) and mixtures thereof. Examples of semiconductors that may be present in the layers comprised between the core of the nanocrystal and the outer layer of the shell are, for example, MgS, MgSe, MgTe, CaS, CaSe, CaTe, SrS, SrSe, SrTe, BaS, BaSe, BaTe, ZnO, ZnS, ZnSe, ZnTe, CdS, CdSe, CdTe, HgS, HgSe, HgTe, SnS, SnSe, SnTe, PbS, PbSe, PbTe and mixtures thereof. More specifically, samples of semiconductors that may be present in the layers comprised between the core of the nanocrystal and the outer layer of the shell are selected from the group consisting of MgS, MgSe, MgTe, CaS, CaSe, CaTe, SrS, SrSe, SrTe, BaS, BaTe, ZnO, ZnS, ZnSe, ZnTe, Sns, SnSe, SnTe and mixtures thereof.

It is thus clear that, in the case of a multi-layer shell, the reaction mixture used within the scope of the present invention and in particular in step (a) further contains the precursors of the elements forming the layers other than the outer layer of the shell.

The nanocrystal prepared according to the method of the present invention has a diameter less than 15 nm, particularly less than 12 nm and in particular less than 10 nm.

The core of the nanocrystal prepared using the method according to the invention has a diameter between 1 and 10 nm, particularly between 1.5 and 8 nm and in particular between 2 and 6 nm.

The shell of the nanocrystal prepared using the method according to the invention has a thickness between 0.3 and 6 nm, particularly between 0.5 and 4 nm and in particular between 1 and 2 nm.

Within the scope of the present invention, the precursor of A used is selected from the group consisting of an indium precursor, a gallium precursor, an aluminium precursor and mixtures thereof. All indium, aluminium and gallium precursors known to those skilled in the art, particularly precursors in liquid or solid form, are suitable for use in the present invention.

Advantageously, the precursor of A is selected from the salts of A, halides of A, oxides of A and organometallic compounds of A. The term "organometallic compound of A" refers, more specifically, to a tri-substituted compound of A, a carboxylate of A or a phosphonate of A.

The term "tri-substituted compound of A", within the scope of the present invention, refers to a compound having the formula $(R_1)_3A$ wherein each $R_1$, identical or different, represents a hydrocarbon group having 1 to 20 carbon atoms such as an alkyl radical, an alkenyl radical, an alkoxy radical, an aryl radical or an aryloxy radical.

The term "carboxylate of A", within the scope of the present invention, refers to a compound having the formula $(R_2COO)_3A$ wherein each $R_2$, identical or different, represents a hydrocarbon group having 1 to 20 carbon atoms such as an alkyl radical, an alkenyl radical, an alkoxy radical, an aryl radical or an aryloxy radical.

The term "phosphonate of A", within the scope of the present invention, refers to a compound having the formula $[R_3—P(OR_4)(OR_5)O]_3A$ wherein each $R_3$, identical or different, represents a hydrocarbon group having 1 to 20 carbon atoms such as an alkyl radical, an alkenyl radical, an alkoxy radical, an aryl radical or an aryloxy radical;

each $R_4$, identical or different, represents a hydrogen atom or a hydrocarbon group having 1 to 20 carbon atoms such as an alkyl radical, an alkenyl radical, an alkoxy radical, an aryl radical or an aryloxy radical and each $R_5$, identical or different, represents a hydrogen atom or a hydrocarbon group having 1 to 20 carbon atoms such as an alkyl radical, an alkenyl radical, an alkoxy radical, an aryl radical or a an aryloxy radical.

Within the scope of the present invention and unless specified otherwise, the term "alkyl group" refers to a linear, branched or cyclic, optionally substituted, alkyl group, having 1 to 20 carbon atoms, particularly having 1 to 15 carbon atoms and, in particular, having 1 to 10 carbon atoms.

Within the scope of the present invention, the term "alkenyl group" refers to a linear, branched or cyclic, optionally substituted, alkenyl group, having 2 to 20 carbon atoms, particularly having 2 to 15 carbon atoms and, in particular, having 2 to 10 carbon atoms.

Within the scope of the present invention, the term "alkoxy group" refers to an oxygen atom substituted by an alkyl as defined above.

Within the scope of the present invention, the term "aryl group" refers to a mono- or polycyclic, optionally substituted, aromatic group, having 6 to 20 carbon atoms, particularly having 6 to 14 carbon atoms, in particular, having 6 to 8 carbon atoms.

Within the scope of the present invention, the term "aryloxy group" refers to an oxygen atom substituted by an aryl as defined above.

Within the scope of the present invention, the term "optionally substituted" refers to a radical substituted by one or a plurality of groups selected from: an alkyl group, an alkoxy group, a halogen, a hydroxyl, a cyano, a trifluoromethyl or a nitro.

Within the scope of the present invention, the term "halogen" refers to a fluorine, chlorine, bromine or iodine.

Examples of precursors of A suitable for use within the scope of the present invention, when A is indium, include indium trichloride, triethyl-indium, indium triacetate, indium tri(acetyl-acetonate), indium trioctonate, indium tristearate, indium trilaurate, indium tripalmitate, indium trimyristate, indium trioleate and mixtures thereof.

Within the scope of the present invention, the precursor of B used is selected from the group consisting of an antimony precursor, an arsenic precursor, a phosphorus precursor, a nitrogen precursor and mixtures thereof. All antimony, arsenic, phosphorus and nitrogen precursors known to those skilled in the art, particularly precursors in liquid or solid form, are suitable for use in the present invention.

Advantageously, the precursor of B used in the present invention is a compound having the formula $B(F(R_6)_3)_3$ or the formula $B(R_7)_3$ wherein each F is selected from the group consisting of silica (Si), germanium (Ge) and tin (Sn);

each $R_6$, identical or different, is a linear, branched or cyclic, optionally substituted, alkyl group, having 1 to 10 carbon atoms, particularly having 1 to 6 carbon atoms and, in particular, having 1 to 3 carbon atoms and each $R_7$, identical or different, is a hydrogen atom, a halogen such as chlorine (Cl), bromine (Br), iodine (I) or fluorine (F) or a linear, branched or cyclic, optionally substituted, alkyl group, having 1 to 10 carbon atoms, particularly having 1 to 6 carbon atoms and, in particular, having 1 to 3 carbon atoms.

In particular, a precursor of B and particularly a preferred phosphorus precursor is the tris(trimethylsilyl) compound of B having the formula $B(Si(CH_3)_3)_3$ or $B(TMS)_3$.

Within the scope of the present invention, the zinc precursor used is selected from the group consisting of zinc salts, zinc halides, zinc oxides and organometallic zinc compounds. The term "organometallic zinc compound" refers more specifically to a bi-substituted zinc compound, a zinc carboxylate or a zinc phosphonate.

The term "bi-substituted zinc compound", within the scope of the present invention, refers to a compound having the formula $(R_8)_2Zn$ wherein each $R_8$, identical or different, represents a hydrocarbon group having 1 to 20 carbon atoms such as an alkyl radical, an alkenyl radical, an alkoxy radical, an aryl radical or an aryloxy radical.

The term "zinc carboxylate", within the scope of the present invention, refers to a compound having the formula $(R_9COO)_2Zn$ wherein each $R_9$, identical or different, represents a hydrocarbon group having 1 to 20 carbon atoms such as an alkyl radical, an alkenyl radical, an alkoxy radical, an aryl radical or an aryloxy radical.

The term "zinc phosphonate", within the scope of the present invention, refers to a compound having the formula $[R_{10}-P(OR_{11})(OR_{12})O]_2Zn$ wherein each $R_{10}$, identical or different, represents a hydrocarbon group having 1 to 20 carbon atoms such as an alkyl radical, an alkenyl radical, an alkoxy radical, an aryl radical or an aryloxy radical;

each $R_{11}$, identical or different, represents a hydrocarbon group having 1 to 20 carbon atoms such as an alkyl radical, an alkenyl radical, an alkoxy radical, an aryl radical or an aryloxy radical and each $R_{12}$, identical or different, represents a hydrocarbon group having 1 to 20 carbon atoms such as an alkyl radical, an alkenyl radical, an alkoxy radical, an aryl radical or an aryloxy radical.

The alkyl, alkenyl, alkoxy, aryl and aryloxy radicals are as defined for the precursors of A.

Within the scope of the present invention, the sulphur precursor used is selected from the group consisting of an aliphatic thiol, elemental sulphur dissolved in an organic solvent and a compound having the formula $S(Si(R_{13})_3)_2$ wherein each $R_{13}$, identical or different, is a linear, branched or cyclic, optionally substituted, alkyl group, having 1 to 10 carbon atoms, particularly having 1 to 6 carbon atoms and, in particular, having 1 to 3 carbon atoms.

Advantageously, the aliphatic thiol has the formula $C_nH_{2n+1}-SH$ where n represents an integer between 1 and 25, particularly between 5 and 20 and, in particular, between 8 and 18. Examples of aliphatic thiols suitable for use within the scope of the present invention include octanethiol (n=8), octodecanethiol (n=18), dodecanethiol (n=12) and mixtures thereof.

Advantageously, the organic solvent wherein the elemental sulphur is dissolved is selected from trialkylphosphines wherein the alkyl group comprises 4 to 12 carbon atoms and alkenes. Examples of organic solvents suitable for use include 1-octadecene, tributylphosphine and trioctylphosphine.

Within the scope of the present invention, the precursor of E optionally used is selected from the group consisting of an oxygen precursor, a selenium precursor, a tellurium precursor and mixtures thereof.

Advantageously, the precursor of E is selected from elemental selenium dissolved in an organic solvent; elemental tellurium dissolved in an organic solvent; zinc acetate; a phosphine selenide; a phosphine oxide; a compound having the formula $E'(Si(R_{14})_3)_2$ wherein E' represents Se or Te and each $R_{14}$, identical or different, is a linear, branched or cyclic, optionally substituted, alkyl group, having 1 to 10 carbon atoms, particularly having 1 to 6 carbon atoms and, in particular, having 1 to 3 carbon atoms, and mixtures thereof.

Advantageously, the organic solvent wherein the elemental selenium and/or elemental tellurium are dissolved is selected from trialkylphosphines wherein the alkyl group comprises 4 to 12 carbon atoms and alkenes. Examples of organic solvents suitable for use include 1-octadecene, tributylphosphine and trioctylphosphine.

More specifically, the phosphine selenides and oxides suitable for use within the scope of the present invention are respectively selected from trialkylphosphine selenides and trialkylphosphine oxides wherein the alkyl group comprises 4 to 12 carbon atoms.

The mixture of at least one precursor of A, at least one precursor of B, at least one zinc precursor, at least one sulphur precursor and optionally at least one precursor of E, particularly the mixture prepared in step (a) of the method according to the invention, is produced in an organic solvent.

Advantageously, said organic solvent is an alkane, a secondary or tertiary amine, or an alkene having a boiling point greater than $T_2$ i.e. greater than the temperature selected for step (b) of the method according to the invention.

The term "alkane" refers, within the scope of the present invention, to a linear, branched or cyclic, optionally substituted, alkane having 1 to 40 carbon atoms, particularly having 10 to 25 carbon atoms and, in particular, having 14 to 20 carbon atoms.

The term "secondary or tertiary amine", within the scope of the present invention, refers to dialkylamines and trialkylamines wherein the alkyl group comprises 4 to 24 carbon atoms, particularly 8 to 20 carbon atoms. For example, the secondary (tertiary) amine suitable for use within the scope of the present invention is dioctylamine (trioctylamine) which comprises 8 carbon atoms per alkyl chain.

The term "alkene", within the scope of the present invention, refers to a linear, branched or cyclic, optionally substituted, alkene, having 2 to 40 carbon atoms, particularly having 10 to 25 carbon atoms and, in particular, having 14 to 20 carbon atoms.

One solvent more specifically used for preparing the precursor mixture in the method according to the invention is 1-octadecene.

Furthermore, the precursor mixture in said solvent may further contain a primary amine. Advantageously, the primary amine is an alkylamine wherein the alkyl group comprises 4 to 24 carbon atoms, particularly 8 to 20 carbon atoms. For example, the primary amine suitable for use within the scope of the present invention is hexadecylamine (HAD which is an alkylamine having 16 carbon atoms).

The concentration of the precursor of A and that of the precursor of B in the mixture during step (a) of the method is between 2.5 and 150 mmol/l, particularly between 5 and 100 mmol/l and in particular between 10 and 20 mmol/l.

The concentration of the zinc precursor and that of the sulphur precursor optionally with the precursor of E is between 5 and 300 mmol/l, particularly between 10 and 200 mmol/l and in particular between 20 and 40 mmol/l.

If the shell of the nanocrystal is multi-layer, the precursors of the various elements, metals and metalloids forming the layers other than the outer layer of the shell are present, in the reaction mixture, at a concentration between 5 and 300 mmol/l, particularly between 10 and 200 mmol/l and in particular between 20 and 40 mmol/l.

The present invention is based on the essential step of progressive heating of the reaction mixture comprising at least one precursor of A, at least one precursor of B, at least one zinc precursor, at least one sulphur precursor and optionally at least one precursor of E. During this step, the progressive heating of the mixture from the initial temperature of the mixture i.e. the temperature $T_1$ to a high temperature $T_2$ makes it possible to successively obtain the formation of the core of the nanocrystal followed by the formation of the shell. In the case of a multi-layer shell, the formation of the layer consists of the successive formation of the consecutive layers of the shell.

Advantageously, the temperature $T_1$ of the precursor mixture is less than 50° C., particularly less than 40° C. and, in particular, less than 30° C. More specifically, the precursor mixture is at ambient temperature. The term "ambient temperature" refers to a temperature of 20° C.±5° C.

The temperature $T_2$ is greater than 180° C., particularly greater than 210° C., in particular between 210° C. and 320° C. and, more specifically, between 230° C. and 300° C. Advantageously, the temperature $T_2$ is in the region of 270° C. The term "in the region of 270° C." refers to a temperature of 270° C.±20° C. and particularly a temperature of 270° C.±10° C.

In a first embodiment of the heating step and in particular step (b) of the method according to the invention, the transition from the temperature $T_1$ to the temperature $T_2$ is carried out in a linear increasing manner.

Advantageously, the linear increase in the temperature is performed with a gradient of 1 to 20° C. per second, particularly a gradient of 2.5 to 15° C. per second and, more specifically, a gradient of 5 to 10° C. per second.

In a second embodiment of the heating step and particularly step (b) of the method according to the invention, the transition from the temperature $T_1$ to the temperature $T_2$ is carried out in an increasing manner with at least one stage.

The term "stage" refers to a temperature T between $T_1$ and $T_2$ which is kept constant for a time between 5 seconds and 2 hours, particularly between 15 seconds and 1 hour, in particular between 30 seconds and 30 minutes and, more specifically, between 1 minute and 15 minutes. The increase in the temperature between the temperatures $T_1$ and $T_2$ may include 1 to 10 stages and particularly 2 to 5 stages. Between $T_1$ and the first stage, between two consecutive stages and between the final stage and $T_2$, the temperature is increased in a linear manner under the conditions as defined for the first embodiment of the heating step.

During the heating step of the method according to the invention (i.e. step (b)), once the temperature $T_2$ has been reached, this temperature may be kept constant for a period between 5 minutes and 5 hours, particularly between 15 minutes and 3.5 hours and, in particular, between 30 minutes and 2 hours.

Those skilled in the art know various techniques and various means for progressively heating the precursor mixture from the temperature $T_1$ to the temperature $T_2$. Examples include the use of a thermostatically-controlled programmable flask or reaction vessel containing the precursor mixture, or the use of a bath previously heated to the required temperature which may be the temperature of one stage or the temperature $T_2$ wherein the flask or reaction vessel containing the precursor mixture is immersed.

All the precursors used within the scope of the present invention are either commercially available products or products for which those skilled in the art know at least one preparation method.

In a first alternative embodiment of step (a) of the method according to the invention, the various precursors used, i.e. the precursor of A, the precursor or B, the zinc precursor, the sulphur precursor and, optionally, the precursor of E are mixed together after having been, optionally, previously prepared. Advantageously, if at least one of the precursors used in step (a) of the method is previously prepared, it is prepared in an aprotic solvent identical or different and, advantageously, identical to the solvent used in step (a).

During the preparation of the mixture, the various precursors may be added to the solvent as defined above at the same time, one after the other and/or in groups of at least two precursors. According to the precursors used, those skilled in the art will be able to determine the best way to introduce the precursors in the mixture.

The example hereinafter is an example of the first alternative embodiment of step (a) of the method according to the invention. In this example, the precursor of A is indium trimyristate previously prepared (step (i)), the precursor of B is tris(trimethylsilyl)phosphine $(P(TMS)_3)$, the zinc precursor is zinc distearate and the sulphur precursor is dodecanethiol (DDT).

In this example, step (a) of the method corresponds to steps (ii) and (iii) with a prior step (i), said steps consisting of:

i) preparing indium trimyristate by reacting indium acetate with three myristic acid $(CH_3—(CH_2)_{12}—COOH)$ equivalents in octadecene by heating to approximately 100° C. in a rough vacuum for one hour. The mixture is then cooled to ambient temperature and stored in an inert atmosphere (nitrogen or argon);

ii) placing the required quantity of the indium precursor prepared in step (i) in a flask or reaction vessel in an argon or nitrogen flow and stirring and, optionally, diluting same with octadecene;

iii) adding to this mixture, at ambient temperature, $P(TMS)_3$, zinc distearate and dodecanethiol.

After step (iii), the reaction mixture obtained is subjected to steps (b) and (c) of the method according to the invention.

In a second alternative embodiment of step (a) of the method according to the invention, at least one of the various precursors used, i.e. at least one precursor selected from the precursor of A, the precursor of B, the zinc precursor, the sulphur precursor and, optionally, the precursor of E, is prepared in situ during step (a).

In this alternative embodiment, each of the precursors not prepared in situ may be added, to the solvent wherein the precursor(s) is/are prepared, before, during and/or after this preparation, independently of each other. The precursors may be added one after another and/or in groups of at least two precursors. According to the precursors used and the conditions used to prepare one (or more) precursor(s) in situ, those skilled in the art would be able to determine the optimum way to introduce the precursors not prepared in situ in the mixture.

The example hereinafter is an example of the second alternative embodiment of step (a) of the method according to the invention. In this example, the precursor of A is indium trimyristate prepared in situ using indium triacetate and myristic acid, the precursor of B is $P(TMS)_3$, the zinc precursor is zinc distearate and the sulphur precursor is DDT. Step (a) comprises the successive steps (i'), (ii') and (iii') consisting of:

i') mixing indium triacetate, myristic acid and $P(TMS)_3$ in a flask;

ii') heating the mixture from step (i') to a temperature between 50 and 150° C. (particularly to 110° C.) for a period of 30 min to 3 hours (particularly for 1 hour) in a rough vacuum (particularly a vacuum in the region of 10-2 mBar) to form the indium precursor;

iii') purging the mixture in step (ii') with inert gas (argon or nitrogen) and adding $P(TMS)_3$ and DDT.

After step (iii'), the reaction mixture obtain is subjected to steps (b) and (c) of the method according to the invention.

It should be noted that, in this specific example, the phosphorus and sulphur precursors are added after the preparation of the indium precursor to prevent the partial evaporation thereof at 100° C. in a vacuum.

Advantageously, steps (a) and (b) of the method according to the invention are performed under stirring. Various means known to those skilled in the art may be used to stir the mixture used in steps (a) and (b) of the method according to the invention. For example, the mixture may be stirred using a stirrer, a bar magnet, a sonication bath or a homogeniser.

During step (c) of the method according to the invention, the nanocrystals obtained are purified from the reaction mixture. Those skilled in the art know various techniques for said purification using a precipitation step, a dilution step and/or a filtration step. The techniques used in the prior art for purifying luminescent nanocrystals are suitable for use within the scope of step (c) of the method according to the invention.

Advantageously, step (c) of the method is implemented at a temperature less than temperature $T_2$. In this way, the reaction mixture obtained following step (b) of the method is cooled or allowed to cool to ambient temperature. The nanocrystals are then purified by means of precipitation using a solvent or a mixture of suitable solvents.

For example, it is possible to use a mixture of an alcohol such as methanol and chloroform (advantageously in a proportion of 1:1 vol:vol) to dilute the reaction mixture obtained following step (b) to double the volume and then precipitate with excess acetone. The nanocrystals are recovered by means of centrifugation and may then be dispersed in organic solvents such as hexane, toluene or chloroform. Purification step (c) of the method according to the invention may optionally be repeated once or more times.

The present invention relates to any nanocrystal having (i) a core comprising a semiconductor comprising A representing a metal or metalloid in the +III oxidation state and B representing an element in the −III oxidation state, coated with (ii) a shell in which the outer portion comprises a semiconductor having the formula $ZnS_{1-x}E_x$, where E represents an element in the −II oxidation state and x is a decimal number such that $0 \leq x < 1$, suitable for being obtained by means of a method according to the present invention.

More specifically, the present invention relates to a nanocrystal having a core comprising a semiconductor comprising indium and phosphorus, coated with a shell in which the outer portion comprises a semiconductor comprising zinc and sulphur, suitable for being obtained by means of a method according to the invention, having a fluorescence quantum yield greater than 45% at ambient temperature, particularly greater than 50% and more specifically greater than 55%.

Those skilled in the art know various techniques making it possible, for a given nanocrystal, to obtain the fluorescence quantum yield thereof at ambient temperature. Examples include the technique consisting of comparing the spectrally integrated emission intensity of a dispersion of nanocrystals according to the invention in hexane having an optical density X at an excitation wavelength Y with that of a rhodamine 6G solution in ethanol having the same optical intensity and at the same excitation wavelength.

The nanocrystals having a core comprising a semiconductor comprising indium and phosphorus, coated with a shell of which the outer portion comprises a semiconductor comprising zinc and sulphur covered by the present invention have a photoluminescence line width less than 80 nm, advantageously less than 60 nm and in particular less than 50 nm.

The present invention relates to the use of a nanocrystal suitable for being prepared according to a method according to the invention or a nanocrystal according to the invention in a light-emitting diode, in a photovoltaic cell and for the fluorescent labelling of chemical or biological molecules.

Further features and advantages of the present invention will emerge to those skilled in the art on reading the examples hereinafter given for illustrative and not limitative purposes, with reference to the appended figures.

DETAILED DESCRIPTION OF SPECIFIC EMBODIMENTS

Figure 1:
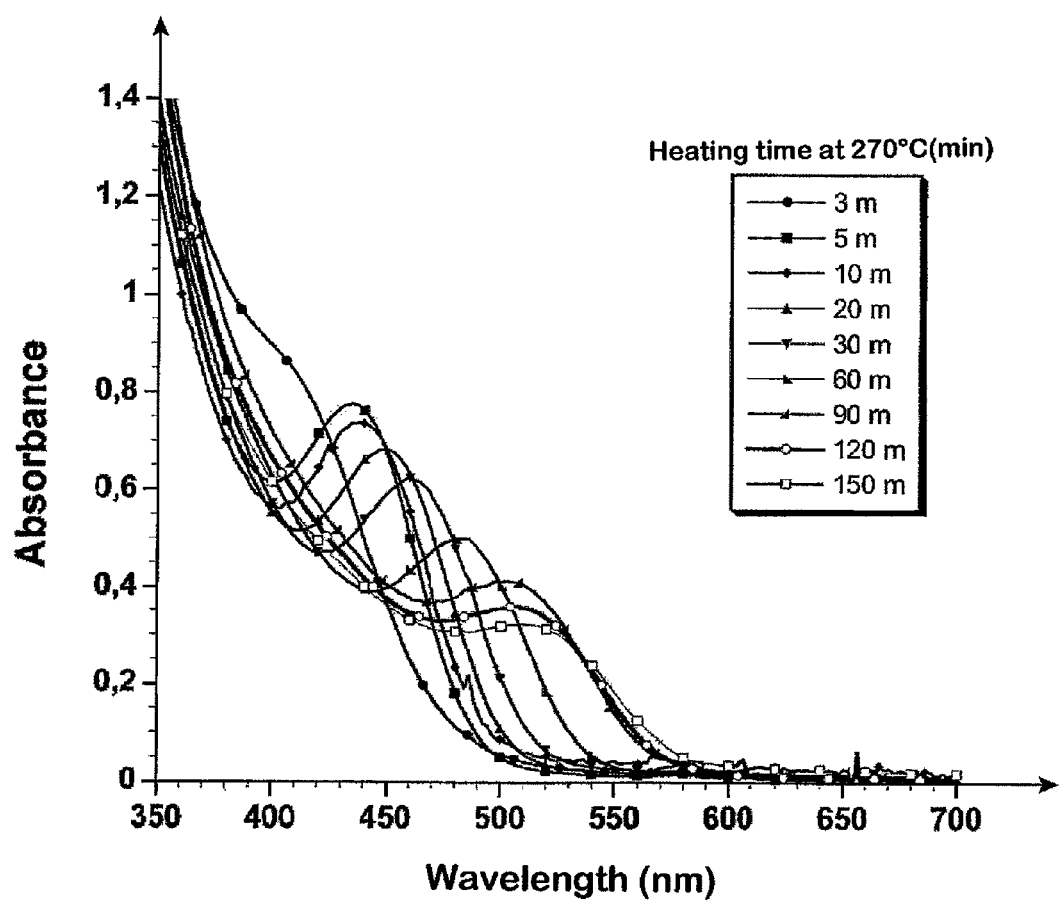
FIG. 1 shows the UV-vis absorption spectra of the samples taken during the experiment described in section II hereinafter.

All handling of air-sensitive materials are performed in a glove box or using a vacuum apparatus (Schlenk technique).

For the characterisations, the UV-visible absorption spectra were measured on a Hewlett-Packard 8425A spectrometer (wavelength spectral range: 190-820 nm, resolution 2 nm), the photoluminescence spectra were acquired with a Hitachi F-4500 spectrometer. For these spectroscopic measurements, the colloidal nanocrystal solutions diluted in hexane were placed in 1 cm optical path quartz cells. The fluorescence quantum yields at ambient temperature were obtained by comparing the spectrally integrated emission intensity of the dispersion of nanocrystals in hexane with that of a rhodamine 6G solution in ethanol, both solutions having the same optical density (<0.03) at the excitation wavelength (490 nm). The X-ray diffractograms were obtained on a Philips X'Pert apparatus, using a Co source, at 50 kV and 35 mA.

All the products with the exception of zinc distearate (Riedel de Haën) were purchased from Sigma-Aldrich and used as is: indium acetate (99.99% purity), myristic acid (purity >99%), zinc distearate (90% purity), dodecanethiol (97% purity), 1-octadecene (90% purity).

I Standard Protocol

I.A. Preparation of Indium Precursor (Indium Myristate)

2 mmol of indium triacetate, 6 mmol of myristic acid and 20 ml of 1-octadecene are placed in a 50 ml flask and mixed using a magnetic stirrer in an inert atmosphere (argon or nitrogen). The temperature is increased to 110° C. and the flask is pumped out using a rough vacuum pump for 1 hour (pressure in flask in the region of $10^{-2}$ mbar). A homogeneous and colourless solution is obtained. The flask is then filled with inert gas (argon or nitrogen) and cooled to ambient temperature. The precursor solution is stored in an inert atmosphere, for example in a glove box.

I.B. InP/ZnS Core/Shell Nanocrystal Synthesis

In an inert atmosphere, 1 ml of the indium precursor, prepared as described in section I.A, 0.2 mmol of zinc distearate, 0.1 mmol of P(TMS)$_3$, 0.2 mmol of dodecanethiol and 6 ml of 1-octadecene are placed in a 50 ml three-necked flask equipped with a condenser and mixed using a magnetic stirrer. The mixture is heated to 230-300° C. with a gradient of approximately 5° C./second and kept at this temperature for 1 to 3 hours.

After cooling to ambient temperature, the InP/ZnS nanocrystals are isolated by adding one volume equivalent of a chloroform/methanol mixture (1:1 vol:vol) and 10 volume equivalents of acetone, followed by centrifugation. The resulting precipitate containing the nanocrystals may be dispersed in organic solvents such as hexane, toluene or chloroform.

II. Protocol for Synthesis without Prior Preparation of Indium Precursor Solution.

In a 50 ml flask equipped with a condenser, 0.1 mmol of indium triacetate, 0.3 mmol of myristic acid, 0.1 mmol of zinc distearate and 8.6 ml of 1-octadecene are placed and mixed using a magnetic stirrer in an inert atmosphere.

The temperature is increased to 110° C. and the flask is pumped out using a rough vacuum pump for 1 hour (pressure in flask in the region of $10^{-2}$ mbar). A homogeneous and colourless solution is obtained. The flask is then filled with inert gas (argon or nitrogen) and cooled to ambient temperature (optional). 0.1 mmol of P(TMS)$_3$ and 1 mmol, diluted in 1 ml of 1-octadecene, are added to the mixture which is heated to 270° C. with a gradient of approximately 5° C./second and kept at this temperature for 150 minutes.

Samples are taken periodically (0.1 ml of the reaction mixture, diluted with 1 ml of chloroform) and analysed by means of UV-vis absorption and photoluminescence spectroscopy.

After cooling to ambient temperature, the InP/ZnS nanocrystals are isolated by adding one volume equivalent of a chloroform/methanol mixture (1:1 vol:vol) and 10 volume equivalents of acetone, followed by centrifugation. The resulting precipitate containing the nanocrystals may be dispersed in organic solvents such as hexane, toluene or chloroform.

III. Variants of Protocol in Section II

In this example, the synthesis of the InP/ZnS core/shell nanocrystals was performed according to variants of protocol II described above.

The protocols observe the method described in section II, but using the reaction parameters summarised in table 2 hereinafter:

| Sample emission peak (nm) | In(ac)$_3$:MA:DDT:Zn(st)$_2$[1] | Temperature (° C.) | Reaction time (hours) |
|---|---|---|---|
| 585 nm | 1:3.5:1:1 | 270 | 3 |
| 546 nm | 1:3.5:0.3:1 | 270 | 1.5 |
| 534 nm | 1:3.5:1:1* | 270 | 1.5 |
| 508 nm | 1:3.5:1:1 | 240 | 1 |
| 490 nm | 1:1:1:1 | 270 | 2 |

[1]In(ac)$_3$: indium triacetate; MA: myristic acid; DDT: dodecanethiol; Zn(st)$_2$: zinc distearate.
*for this reaction, octadecanethiol was used instead of dodecanethiol (DDT).

IV. Characterisation of Nanocrystals Obtained Using Method According to the Invention IV.A. Optical Properties There are two means for controlling the size of the nanocrystals obtained and thus the emission colour thereof: 1) with the reaction time 2) by adjusting the reaction parameters.

Figure 2:
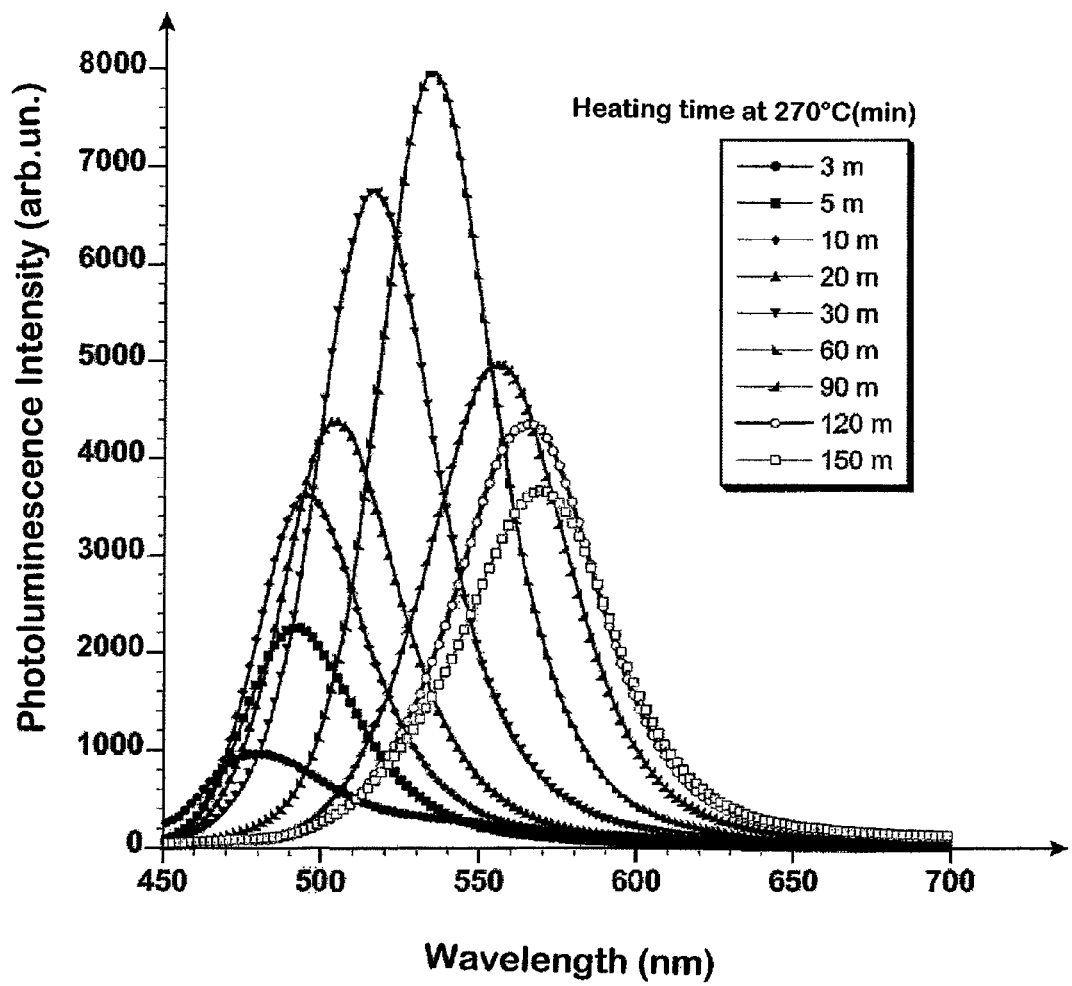
FIG. 2 shows the photoluminescence spectra of the samples taken during the experiment described in section II hereinafter. The excitation wavelength is 420 nm.
Figure 3:
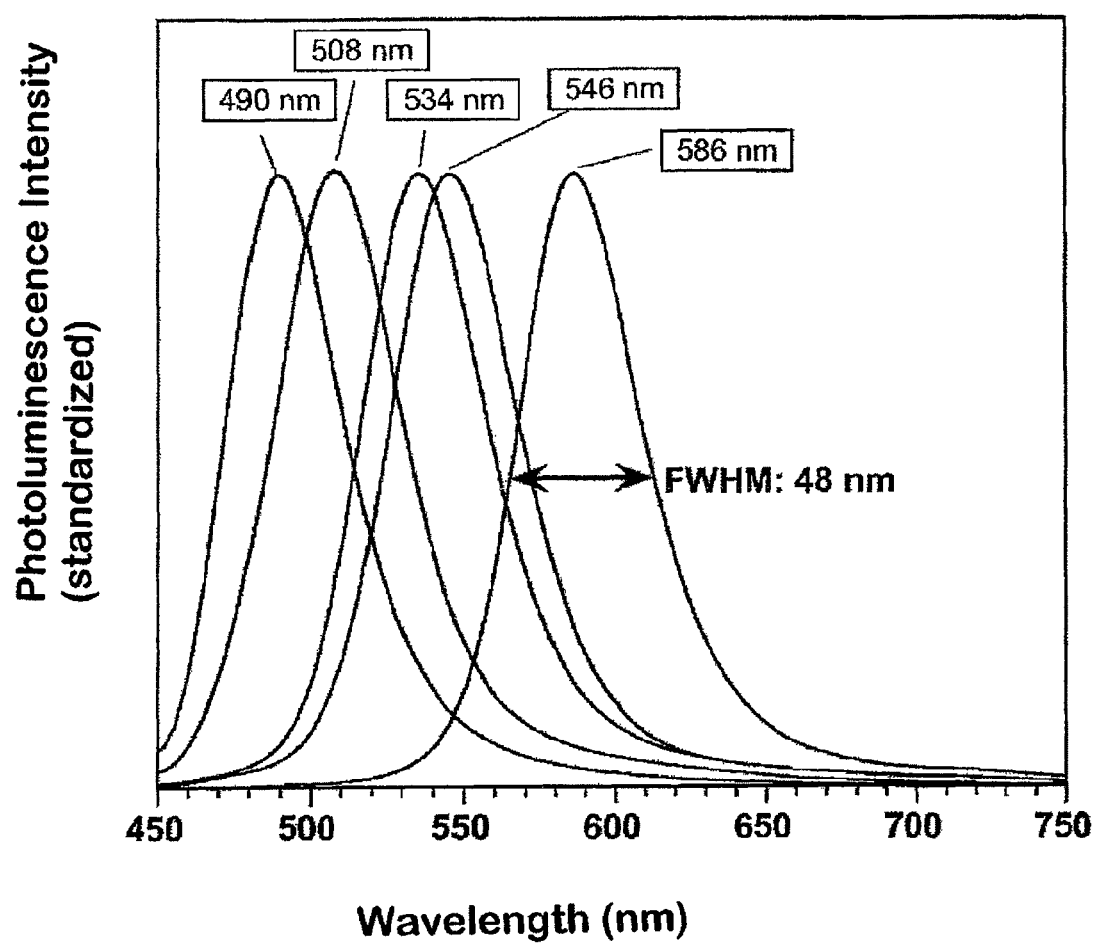
FIG. 3 shows the photoluminescence spectra of the samples prepared according to the protocol described in section III hereinafter. The excitation wavelength is 420 nm.

The UV-vis absorption and photoluminescence spectra of the samples obtained after the method as described in section II are shown in FIGS. 1 and 2, respectively. The photoluminescence spectra of the samples obtained with the method as described in section III are shown in FIG. 3.

The excitonic peak of the samples is clearly pronounced, especially for those obtained between 5 minutes and 120 minutes of reaction time (FIG. 1). This feature indicates a narrow size dispersion which is confirmed by analysing the widths of the lines in the photoluminescence spectra (FIG. 2) which are situated about 40-50 nm (FWHM, full width at half-maximum).

IV.B. Optical Property Stability

For the technological application of the fluorescent nanocrystals, particular attention should be paid to the stability of the optical properties thereof over time and particularly to irradiation-induced ageing.

In order to test the stability of the samples obtained, they were subjected to continuous irradiation with a UV lamp emitting at 365 nm.

Said lamp is positioned at a distance of 4 cm from the samples situated in quartz cells in the presence of air. The irradiation power at this distance is approximately 2-3 mW.

Figure 4:
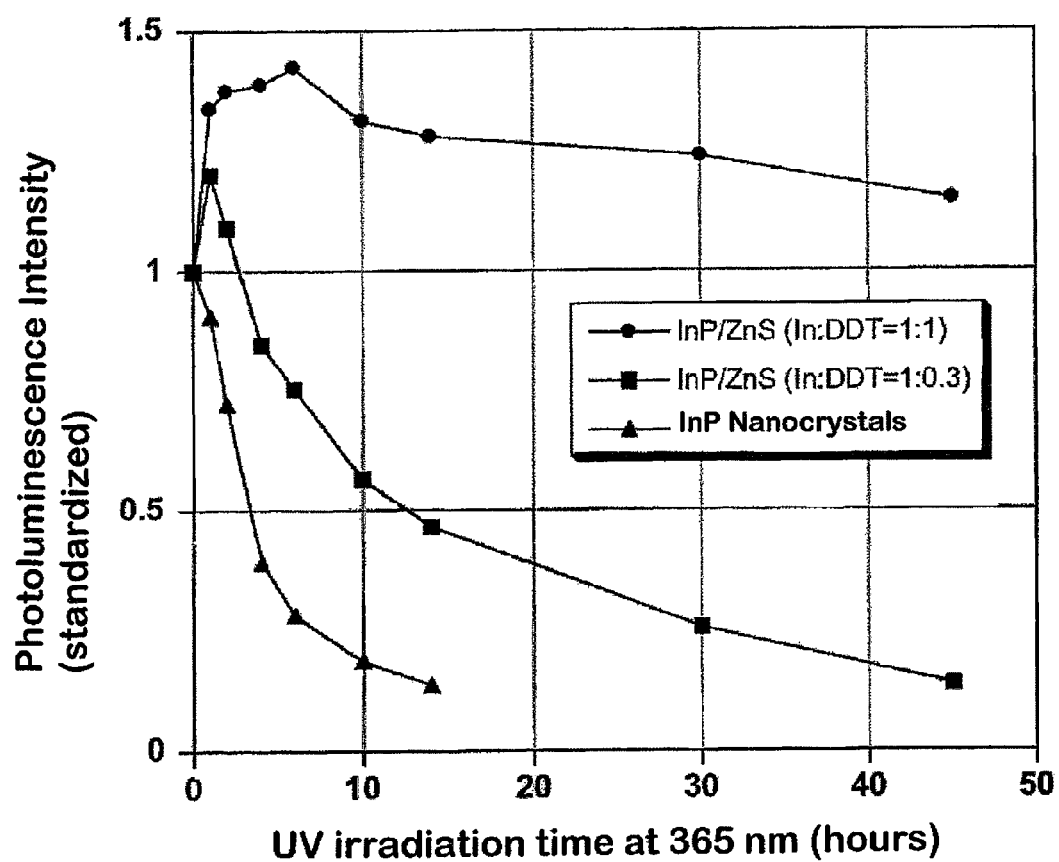
FIG. 4 is a representation of the photoluminescence intensity as a function of the irradiation time with a UV lamp (365 nm) in the presence of air. The InP core nanocrystals are compared to the nanocrystals prepared with a small quantity of dodecanethiol (In:DDT=1:0.3) and to InP/ZnS core/shell nanocrystals synthesised with the protocol described in section I hereinafter (In:DDT=1:1).

FIG. 4 shows the progression of the photoluminescence intensity of 3 different samples.

A rapid decline is observed for the InP nanocrystals without a ZnS shell (nanocrystals not covered by the present invention and used for comparison purposes) which lose practically all the emission thereof after 10-15 hours of irradiation.

Similarly, a sample having a thin shell (In:DDT=1:0.3) prepared according to the method as described in section I has an improved optical property stability compared to that of nanocrystals without a ZnS shell. In this way, after 12 hours of irradiation, 50% of the initial photoluminescence intensity is still detected, and the emission only practically stops after 40-50 hours.

Finally, the core/shell sample manufactured with a greater quantity of sulphur precursor (In:DDT=1:1) behaves completely differently. At the start of irradiation (0-10 hours), an increase in the photoluminescence intensity to approximately 140% of the initial value thereof is observed. Even after 45 hours (discontinuation of experiment), more than 110% of the initial intensity is measured, which confirms the very satisfactory photo-stability of the sample.

IV.C. Physicochemical X-ray Diffractometry Analysis

Figure 5:
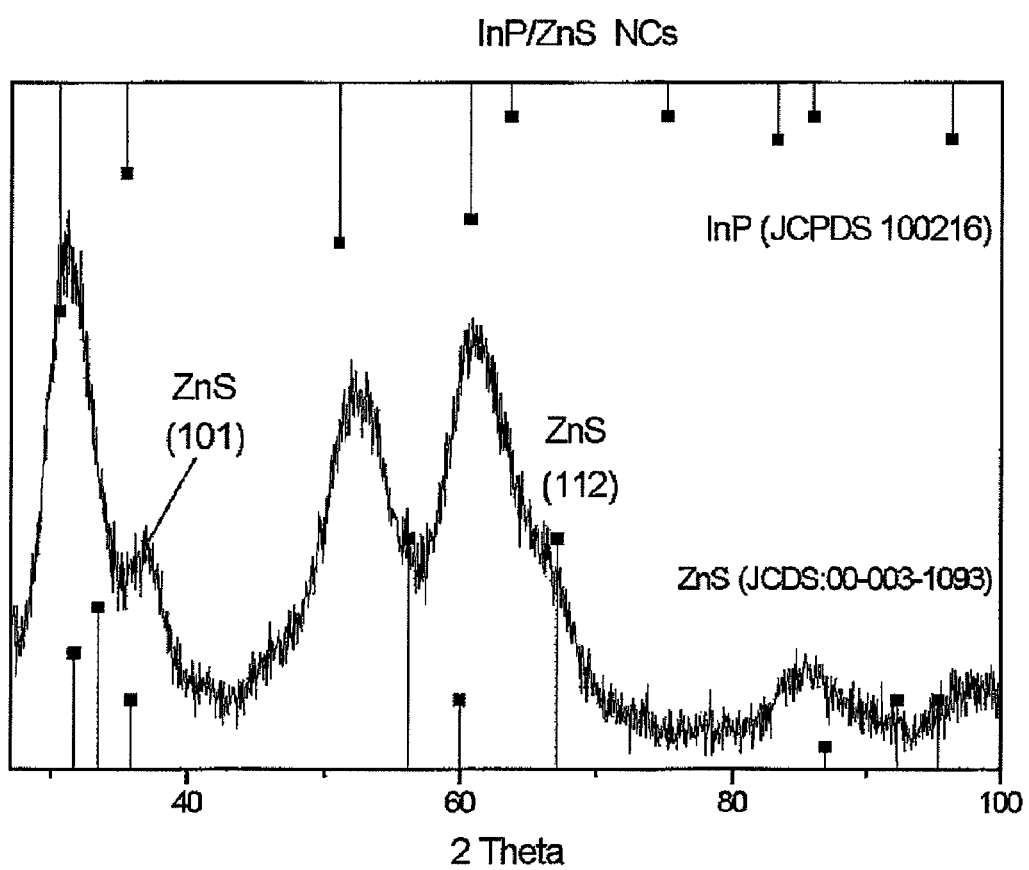
FIG. 5 shows the X-ray powder diffractogram of a sample prepared according to the method described in section II hereinafter, but using 0.06 mmol of P(TMS)$_3$ and a temperature of 240° C. for 1 hour.

The X-ray powder diffractogram for a core/shell sample shown in FIG. 5 confirms the InP/ZnS heterostructure. The core/shell sample used in this example was prepared according to the method as described in section II hereinafter.

The peaks, extended due to the nanometric size of the crystallites, comprise both the contribution of the InP cubic phase ("Joint Committee on Powder Diffraction Standard" card, JCPDS, No. 100216) and the ZnS zinc blend structure (JCPDS card No. 003-1093).

REFERENCES

1. Micic, O. I.; Curtis, C. J.; Jones, K. M.; Sprague, J. R.; Nozik, A. J., SYNTHESIS AND CHARACTERIZATION OF INP QUANTUM DOTS. Journal of Physical Chemistry 1994, 98, (19), 4966-4969.
2. Guzelian, A. A.; Katari, J. E. B.; Kadavanich, A. V.; Banin, U.; Hamad, K.; Juban, E.; Alivisatos, A. P.; Wolters, R. H.; Arnold, C. C.; Heath, J. R., Synthesis of size-selected, surface-passivated InP nanocrystals. Journal of Physical Chemistry 1996, 100, (17), 7212-7219.
3. Micic, O. I.; Sprague, J. R.; Curtis, C. J.; Jones, K. M.; Machol, J. L.; Nozik, A. J.; Giessen, H.; Fluegel, B.; Mohs, G.; Peyghambarian, N., SYNTHESIS AND CHARACTERIZATION OF INP, GAP, AND GAINP2 QUANTUM DOTS. Journal of Physical Chemistry 1995, 99, (19), 7754-7759.
4. Battaglia, D.; Peng, X. G., Formation of high quality InP and InAs nanocrystals in a noncoordinating solvent. Nano Letters 2002, 2, (9), 1027-1030.
5. Micic, O. I.; Smith, B. B.; Nozik, A. J., Core-shell quantum dots of lattice-matched ZnCdSe2 shells on InP cores: Experiment and theory. Journal of Physical Chemistry B 2000, 104, (51), 12149-12156.
6. Haubold, S.; Haase, M.; Kornowski, A.; Weller, H., Strongly luminescent InP/ZnS core-shell nanoparticles. Chemphyschem 2001, 2, (5), 331-334.
7. Xie, R.; Battaglia, D.; Peng, X., Colloidal InP nanocrystals as efficient emitters covering blue to near-infrared. Journal of the American Chemical Society 2007, 129, (50), 15432-15433.

The invention claimed is:

1. A method for preparing a nanocrystal having (i) a core comprising a semiconductor comprising A representing a metal or metalloid in the +III oxidation state and B representing an element in the −III oxidation state, coated with (ii) a shell in which the outer portion comprises a semiconductor having the formula $ZnS_{1-x}E_x$, where E represents an element in the −II oxidation state and x is a decimal number such that $0 \leq x < 1$, the method comprising:
   heating a mixture of at least one precursor of A, at least one precursor of B, at least one precursor of zinc, at least one precursor of sulphur and, optionally, at least one precursor of E, from a temperature $T_1$ to a temperature $T_2$ greater than $T_1$ in an increasing manner and so as to form, firstly, said core then said shell.

2. The preparation method according to claim 1, further comprising the following steps:
   a. preparing a mixture of at least one precursor of A, at least one precursor of B, at least one zinc precursor, at least one sulphur precursor, and optionally at least one precursor of E, at said temperature $T_1$;
   b. heating the mixture obtained in step (a) to said temperature $T_2$; and
   c. purifying the nanocrystal having a core comprising a semiconductor having the formula AB encompassed by a shell in which the outer layer comprises a semiconductor having the formula $ZnS_{1-x}E_x$, obtained in step (b).

3. The preparation method according to claim 1, wherein said nanocrystal has a diameter less than 15 nm.

4. The preparation method according to claim 1, wherein said precursor of A is selected from the group consisting of an indium precursor, a gallium precursor, an aluminium precursor, and mixtures thereof.

5. The preparation method according to claim 1, wherein said precursor of A is selected from the salts of A, halides of A, oxides of A, and organometallic compounds of A.

6. The preparation method according to claim 1, wherein said precursor of B is selected from the group consisting of an antimony precursor, an arsenic precursor, a phosphorus precursor, a nitrogen precursor, and mixtures thereof.

7. The preparation method according to claim 1,
   wherein said precursor of B is a compound having the formula $B(F(R_6)_3)_3$ or the formula $B(R_7)_3$, and
   wherein
   each F is selected from the group consisting of silica (Si), germanium (Ge), and tin (Sn),
   each $R_6$, identical or different, is a linear, branched or cyclic, optionally substituted, alkyl group, having 1 to 10 carbon atoms, and each $R_7$, identical or different, is a hydrogen atom, a halogen or a linear, branched or cyclic, optionally substituted, alkyl group, having 1 to 10 carbon atoms.

8. The preparation method according to claim 1, wherein said zinc precursor is selected from the group consisting of zinc salts, zinc halides, zinc oxides, and organometallic zinc compounds.

9. The preparation method according to claim 1,
wherein said sulphur precursor is selected from the group consisting of an aliphatic thiol, elemental sulphur dissolved in an organic solvent, and a compound having the formula $S(Si(R_{13})_3)_2$, and
wherein each $R_{13}$, identical or different, is a linear, branched or cyclic, optionally substituted, alkyl group, having 1 to 10 carbon atoms.

10. The preparation method according to claim 1, wherein said precursor of E is selected from the group consisting of an oxygen precursor, a selenium precursor, a tellurium precursor, and mixtures thereof.

11. The preparation method according to claim 1,
wherein said precursor of E is selected from elemental selenium dissolved in an organic solvent, elemental tellurium dissolved in an organic solvent, zinc acetate, a phosphine selenide, a phosphine oxide, and a compound having the formula $E'(Si(R_{14})_3)_2$, and
wherein E' represents Se or Te and each $R_{14}$, identical or different, is a linear, branched or cyclic, optionally substituted, alkyl group, having 1 to 10 carbon atoms.

12. The preparation method according to claim 1, wherein said mixture is produced in an organic solvent.

13. The preparation method according to claim 12, wherein said organic solvent is an alkane, a secondary or tertiary amine, or an alkene having a boiling point greater than $T_2$.

14. The preparation method according to claim 1, wherein said mixture further contains a primary amine.

15. The preparation method according to claim 1, wherein the temperature $T_1$ of the precursor mixture is less than 50° C.

16. The preparation method according to claim 1, wherein the temperature $T_2$ is greater than 180° C.

17. The preparation method according to claim 1, wherein the transition from the temperature $T_1$ to the temperature $T_2$ is carried out in a linear increasing manner with a gradient of 1 to 20° C. per second.

18. The preparation method according to claim 1, wherein the transition from the temperature $T_1$ to the temperature $T_2$ is carried out in an increasing manner with at least one stage.

19. The preparation method according to claim 1, wherein, once the temperature $T_2$ has been reached, this temperature is kept constant for a period between 5 minutes and 5 hours.

20. The preparation method according to claim 1, wherein at least one precursor selected from the precursor of A, the precursor of B, the zinc precursor, the sulphur precursor and, optionally, the precursor of E, is prepared in situ during step (a).

21. The preparation method according to claim 3, wherein said nanocrystal has a diameter less than 12 nm.

22. The preparation method according to claim 21, wherein said nanocrystal has a diameter less than 10 nm.

23. The preparation method according to claim 15, wherein the temperature $T_1$ of the precursor mixture is less than 40° C.

24. The preparation method according to claim 23, wherein the temperature $T_1$ of the precursor mixture is less than 30° C.

25. The preparation method according to claim 16, wherein the temperature $T_2$ is greater than 210° C.

26. The preparation method according to claim 25, wherein the temperature $T_2$ is between 210° C. and 320° C.

27. The preparation method according to claim 26, wherein the temperature $T_2$ is between 230° C. and 300° C.

28. The preparation method according to claim 19, wherein, once the temperature $T_2$ has been reached, this temperature is kept constant for a period between 15 minutes and 3.5 hours.

29. The preparation method according to claim 28, wherein, once the temperature $T_2$ has been reached, this temperature is kept constant for a period between 30 minutes and 2 hours.

\* \* \* \* \*